United States Patent
Liaw

(10) Patent No.: US 6,174,775 B1
(45) Date of Patent: Jan. 16, 2001

(54) METHOD FOR MAKING A DUAL GATE STRUCTURE FOR CMOS DEVICE

(75) Inventor: Jhon-Jhy Liaw, Taipei (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/344,400

(22) Filed: Jun. 25, 1999

(51) Int. Cl.⁷ .................................................. H01L 21/336
(52) U.S. Cl. ........................ 438/283; 438/176; 438/157; 257/369; 257/72
(58) Field of Search .................................. 438/231, 157, 438/176, 283; 257/369, 172

(56) References Cited

U.S. PATENT DOCUMENTS

| | | | |
|---|---|---|---|
| 5,341,014 | 8/1994 | Fujii et al. | 257/377 |
| 5,342,794 | 8/1994 | Wei | 437/31 |
| 5,355,010 | 10/1994 | Fujii et al. | 257/377 |
| 5,528,065 | 6/1996 | Battersby et al. | 257/365 |
| 5,640,037 | * 6/1997 | Blanchard | 257/369 |
| 5,736,436 | * 4/1998 | Matsumoto et al. | 438/157 |
| 5,877,535 | 3/1999 | Matsumoto | 257/369 |
| 5,976,925 | * 11/1999 | Cheek et al. | 438/231 |
| 6,051,459 | * 4/2000 | Gardner et al. | 438/231 |

* cited by examiner

*Primary Examiner*—Charles Bowers
*Assistant Examiner*—David S. Blum
(74) *Attorney, Agent, or Firm*—George O. Saile; Stephen B. Ackerman

(57) ABSTRACT

A process for fabricating a polycide, dual gate structure, for CMOS devices, featuring an undoped polysilicon layer, located between an overlying metal silicide layer, and an underlying dual doped polysilicon layer, has been developed. A first undoped polysilicon layer is converted to the dual doped polysilicon layer, via formation of an N type doped region, in a first portion of the first undoped polysilicon layer, overlying subsequent nMOS devices, in a P well region, followed by the formation of a P type doped region, in a second portion of the first undoped polysilicon layer, overlying subsequent pMOS devices, in an N well region. A second undoped polysilicon layer is deposited on the dual doped polysilicon layer, to provide a low diffusion coefficient buffer layer, to prevent auto-doping of the dual doped polysilicon layer, as a result of direct dopant diffusion into the overlying, high diffusion coefficient, metal silicide layer, followed by redistribution into the underlying dual doped polysilicon layer. The use of the undoped polysilicon, buffer layer, allows the use of high temperature procedures, such as procedures used with self-aligned contact structures, without the risk of the auto-doping phenomena.

30 Claims, 6 Drawing Sheets

METHOD FOR MAKING A DUAL GATE STRUCTURE FOR CMOS DEVICE

BACKGROUND OF THE INVENTION (1) Field of the Invention

The present invention relates to methods used to fabricate semiconductor devices, and more specifically to a method used to create a gate structure, for a complementary metal oxide semiconductor, (CMOS), device, comprised with a P type doped region, in a first region of the gate structure, and comprised with an N type doped region, in a second region of the gate structure.

(2) Description of the Related Art

The objective of increasing semiconductor device performance has been successfully addressed by the trend to micro-miniaturization, or the ability to fabricate semiconductor devices, using sub-micron features. However when using sub-micron features to fabricate a buried channel, P channel, or pMOS, type device, an undesirable, yield and reliability degrading, short channel effect, can result. Therefore the pMOS devices, in the CMOS cell, are now being fabricated as surface channel devices, similar to the N channel, or nMOS counterparts. However to avoid higher threshold, and operating voltages, encountered when using an N type, polysilicon gate structure, for the surface channel, pMOS device, a P doped gate structure is employed, resulting in a minimum work function, hence a lower threshold voltage. However to obtain the same threshold voltage benefits, the nMOS devices still have to be fabricated using N doped, gate structures. Thus the use of a continues dual gate structure, comprised of polysilicon, or polycide, (metal silicide-polysilicon), featuring P type doped regions, overlying subsequent pMOS channel regions, and N type doped regions, overlying subsequent nMOS channel regions, is used to traverse both the CMOS cell.

The use of polycide gate structure, improving performance as a result of lower word line resistance, can however present problems, when used as a component of a dual gate structure. The diffusion coefficient for dopants such as boron, phosphorous and arsenic, is about five orders of magnitude higher in metal silicide layers, than the diffusion coefficient for these same dopants in polysilicon. Therefore during subsequent hot process procedures, such as source/drain activation anneals, or the formation of self-aligned contact openings, and structures, dopants in the polysilicon component of the polycide gate structure, can enter the metal silicide component of the polycide gate structure, then quickly move laterally in the metal silicide, and perhaps diffuse into an underlying region of the polysilicon component, that has been doped with a dopant of the opposite type. This auto-doping phenomena can result in unwanted threshold voltages, for the subsequent CMOS devices.

This present invention will describe a process for forming a polycide, dual gate structure, however this invention will feature the use of an undoped polysilicon layer, placed between the underlying, dual doped, polysilicon component, and the overlying metal silicide layer. Therefore during subsequent process steps, performed at elevated temperatures, only slow, or no movement of dopants, into the undoped polysilicon layer occurs, avoiding the auto-doping phenomena, and thus allowing the designed and desired operating and threshold voltages, to be maintained. Prior art, such as Fujii et al, in U.S. Pat. No. 5,341,041, as well as Matsumoto in U.S. Pat. No. 5,877,535, describe processes for reducing auto-doping, in a dual gate structure, via use of pre-doping of the metal silicide component. However these prior arts do not describe the novel approach of using an undoped polysilicon layer, used to prevent dopants from the polysilicon component of a polycide, dual gate structure, from reaching the metal silicide component of the polycide structure, where it can initiate the unwanted auto-doping phenomena.

SUMMARY OF THE INVENTION

It is an object of this invention to fabricate CMOS devices, comprised of surface channel type, pMOS devices, and surface channel, nMOS devices.

It is another object of this invention to use a polycide, dual gate structure, comprised of an overlying metal silicide layer, and a dual doped polysilicon layer, with a first region of the dual doped polysilicon layer comprised with P type dopants, in the region in which the polycide, dual gate structure, overlays pMOS devices, and comprised with N type dopants, in a second region of the dual doped polysilicon layer, in region in which the polycide, dual gate structure overlays nMOS devices.

It is still another object of this invention to use an undoped polysilicon layer, located between the overlying metal silicide component, and the underlying dual doped polysilicon component of the polycide, dual gate structure.

In accordance with the present invention a method of fabricating a polycide, dual gate structure, for CMOS devices, comprised of surface channel type, nMOS, as well as surface channel pMOS devices, and featuring an undoped polysilicon layer, located between an overlying metal silicide component, and an underlying dual doped, polysilicon component of the polycide, dual gate structure, is described. A gate insulator layer is formed on the surface of a semiconductor substrate, with the semiconductor substrate comprised with an N well regions, in a region to be used for subsequent pMOS regions, and comprised with a P well regions, in a region to be used for subsequent nMOS regions. A polysilicon layer is deposited, and is doped P type, in areas in which the subsequent gate structure will overlay N well regions, or regions in which subsequent pMOS devices will be formed, and is doped N type, in areas in which the subsequent gate structure will overlay P well regions, or regions in which subsequent nMOS devices will be formed. After deposition of an undoped polysilicon layer, and of an overlying metal silicide layer, patterning procedures are employed to create a polycide, dual gate structure, comprised of an overlying metal silicide component, and of an underlying, dual doped polysilicon component, and featuring an undoped polysilicon component, located between the metal silicide, and dual doped polysilicon components. Formation of P type, lightly doped source/drain regions, in the pMOS regions, and formation of N type, lightly doped source/drain regions, in the nMOS regions, is followed by the formation of insulator spacers on the sides of the polycide, dual gate structure. Heavily doped N type, source/drain regions are next formed for the nMOS devices, followed by the formation of heavily doped, P type, devices, for the pMOS devices. Borderless, or self-aligned contact openings, are next formed, followed by the creation of self-aligned contact structures, located in the self-aligned contact openings, contacting the heavily doped source/drain regions, of the CMOS devices.

BRIEF DESCRIPTION OF THE DRAWINGS

The object and other advantages of this invention are best described in the preferred embodiments with reference to the attached drawings, that include.

DESCRIPTION OF THE PREFERRED EMBODIMENTS

Figure 1A:
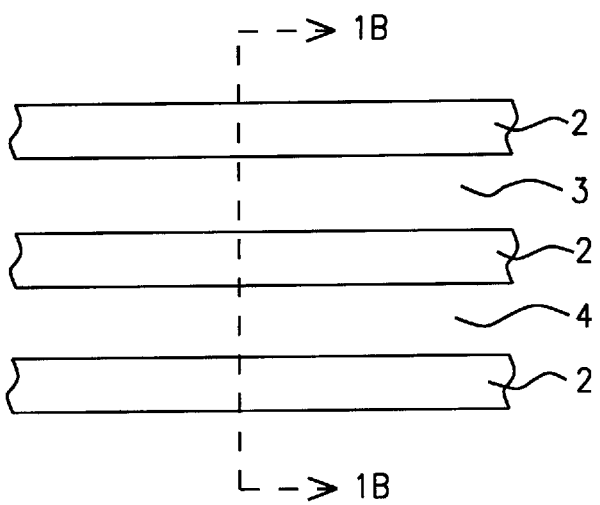
FIGS. 1A, 2A, 7A, which schematically show the top view of the polycide, dual gate structure, of this invention, at key stages of fabrication.
Figure 1B:
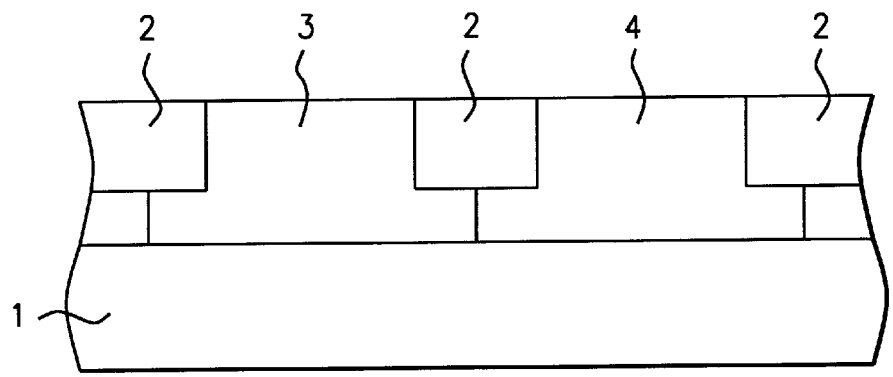
FIGS. 1B, 2B, 3, 4, 5, 6, 7B, 7C, 8, 9, which schematically, in cross-sectional style, show key stages of fabrication, used to create the polycide, dual gate structure, featured in this invention.

The method of fabricating a polycide, dual gate structure, for CMOS devices, comprised of surface channel type, nMOS, and surface channel type, pMOS devices, and featuring the use of an undoped polysilicon layer, located between the overlying metal silicide component, and the underlying dual doped, polysilicon component of the polycide, dual gate structure, will now be described in detail. A P type, semiconductor substrate 1, comprised of single crystalline silicon, with a <100> crystallographic orientation, is used and schematically shown, in cross-sectional form, in FIG. 1B. Isolation regions 2, comprised of either thermally grown, field oxide, (FOX), regions, or insulator filled shallow trench regions, are formed via conventional procedures, and shown in cross-sectional form, in FIG. 1B, and shown as a top view in FIG. 1A. The FOX isolation option is accomplished using a oxidation resistant shape, such as a silicon nitride shape, to prevent growth of silicon dioxide isolation regions from forming in areas of semiconductor substrate 1, to be used for active device regions. The thermal oxidation of non-protected areas of semiconductor substrate 1, result in a FOX isolation region, at a thickness between about 2500 to 4000 Angstroms. The oxidation resistant shape is then removed exposing the nonoxidized, active device regions. The shallow trench isolation option is achieved via definition of a shallow trench region, at a depth between about 2500 to 5000 Angstroms, in semiconductor substrate 1, via the use of conventional photolithographic and dry etching procedures. The deposition of a silicon oxide layer, and the removal of the regions of the silicon oxide layer, residing on the top surface of semiconductor substrate 1, result in the formation of shallow trench isolation regions 2, shown schematically, in cross-sectional style in FIG. 1A, and in the top view in FIG. 1A.

P well region 3, and N well region 4, are next formed in regions of semiconductor substrate 1, to be used to accommodate nMOS devices, and pMOS devices, respectfully. Conventional photolithographic blockout procedures, are first employed, to allow a P type, ion implantation procedure, using boron ions, at an energy between about 150 to 350 KeV, at a dose between about 5E12 to 5E13 atoms/cm$^2$, to create P well region 3, shown in FIG. 1A, and FIG. 1B. The P type doping of P well region 3, needed for subsequent nMOS devices, has to be at a higher level than the P type concentration of semiconductor substrate 1, thus the need for the P well region. After removal of the photoresist shape, used as a blockout mask for formation of P well region 3, another photoresist shape is used as a blockout mask, protecting P well region from an arsenic, or a phosphorous, ion implantation procedure, performed at an energy between about 200 to 1000 KeV, at a dose between about 5E12 to 5E13 atoms/cm$^2$, creating N well region 4. N well region 4, shown schematically, in cross-sectional style in FIG. 1B, and for a top view, in FIG. 1A, will be used to accommodate the subsequent pMOS devices, of the CMOS cell. The dopants used for both wells are activated during subsequent high temperature processing steps, such as gate insulator formation. Additional ion implantation procedures are performed to adjust the doping levels, at the top surface of both the P well region 3, as well as N well region 4, to allow surface channel type, nMOS, as well as pMOS, devices to be achieved, and allowing the subsequent, desired threshold voltages to be achieved. The threshold adjust, ion implantation regions, are not shown in the drawings.

Figure 2A:
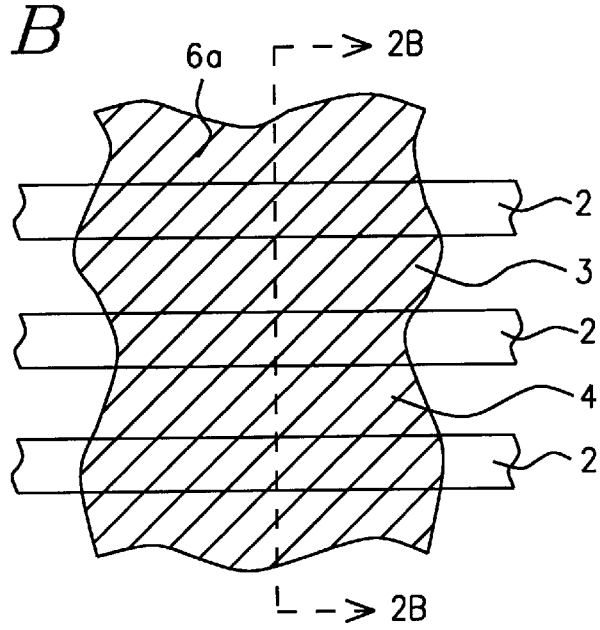
Figure 2B:
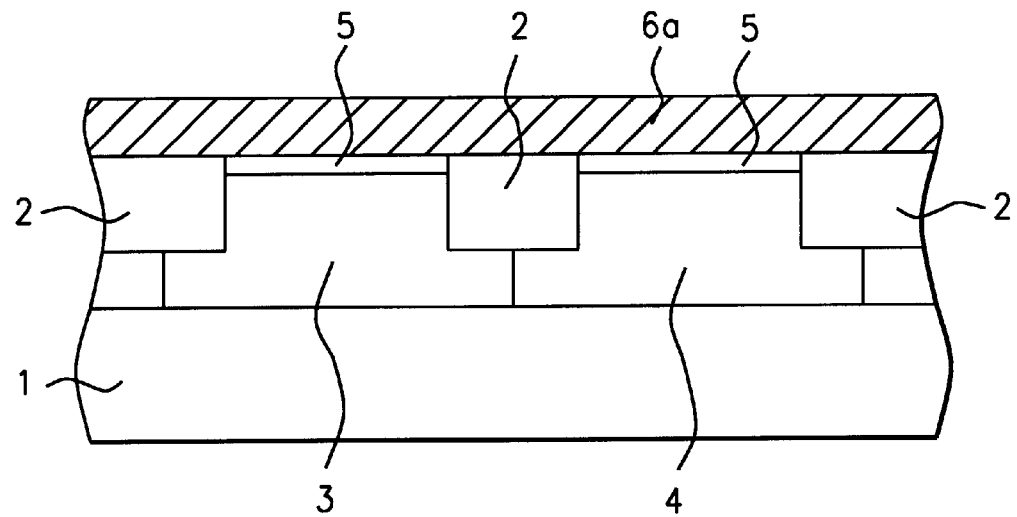
Figure 3:
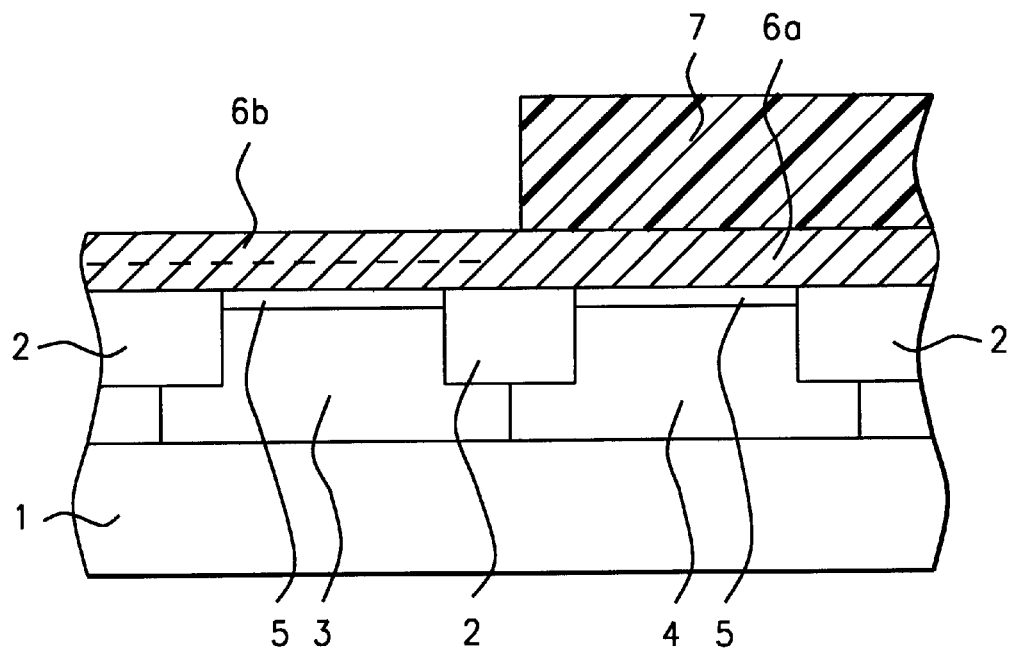
Figure 4:
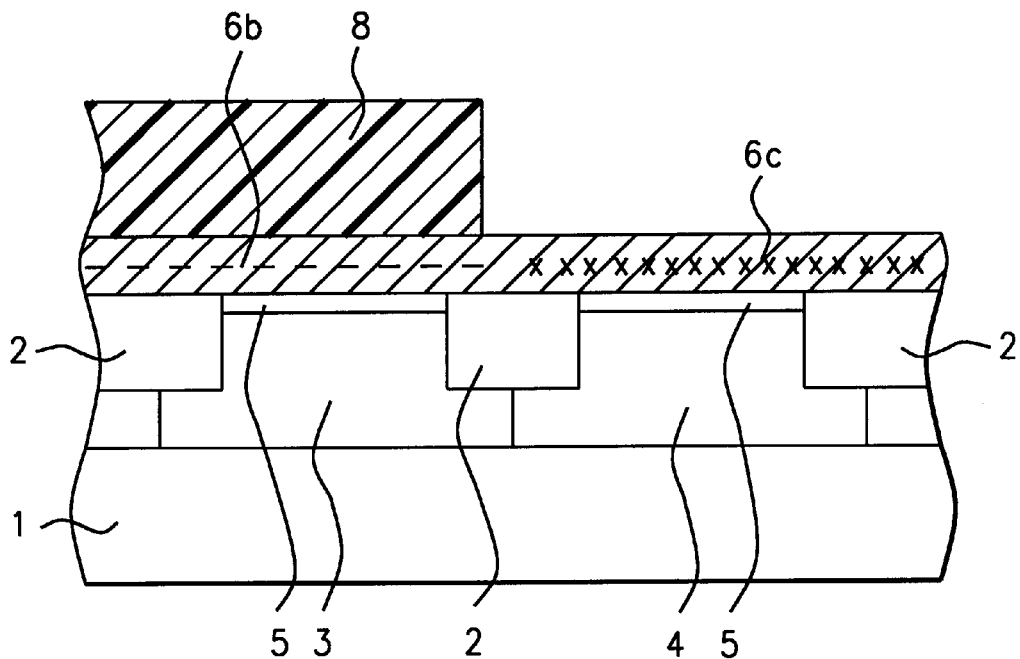

A gate insulator layer 5, comprised of silicon dioxide, is next thermally grown, in an oxygen-steam ambient, at a thickness between about 20 to 200 Angstroms, on the surface of semiconductor substrate 1, comprised of P well region 3, and N well region 4. A polysilicon layer 6a, is then deposited, via low pressure chemical vapor deposition, (LPCVD), procedures, at a thickness between about 1000 to 3000 Angstroms. The result of these procedures are schematically shown, in cross-sectional style in FIG. 2B, and for the top view in FIG. 2A. In order to obtain the desired threshold voltages, for the subsequent nMOS and pMOS devices, it is imperative to create a dual gate structure, in which the polysilicon component of a dual gate structure, is comprised with N type dopants in the region where the polysilicon component, of the dual gate structure, traverses underlying nMOS devices, and where the polysilicon component, of the dual gate structure, is comprised with P type dopants, in the region in of the polysilicon component of the dual gate structure, which traverses the underlying pMOS devices. This doping configuration results in the work function needed to obtain the desired threshold voltage for the surface channel type, nMOS, and pMOS devices. FIGS. 3–4, schematically show the procedures used to create a dual doped, polysilicon layer. First, photoresist shape 7, is used as a blockout mask, to allow an ion implantation procedure, using arsenic, or phosphorous ions, at an energy between about 10 to 60 KeV, at a dose between about 1E15 to 6E15 atoms/cm$^2$, to create N type, polysilicon region 6b, directly overlying P well region 3. After removal of photoresist shape 7, via plasma oxygen ashing and careful wet cleans, photoresist shape 8, is formed, and used to protect N type, polysilicon region 6b, from an ion implantation procedure, using boron, or $BF_2$ ions, at an energy between about 2 to 10 KeV, for boron ions, and between about 10 to 50 KeV, for $BF_2$ ions, both at a dose between about 1E15 to 6E15 atoms/cm$^2$, creating P type, polysilicon region 6c, directly overlying N well region 4. Removal of photoresist shape 8, is accomplished via plasma oxygen ashing and careful wet cleans.

Figure 5:
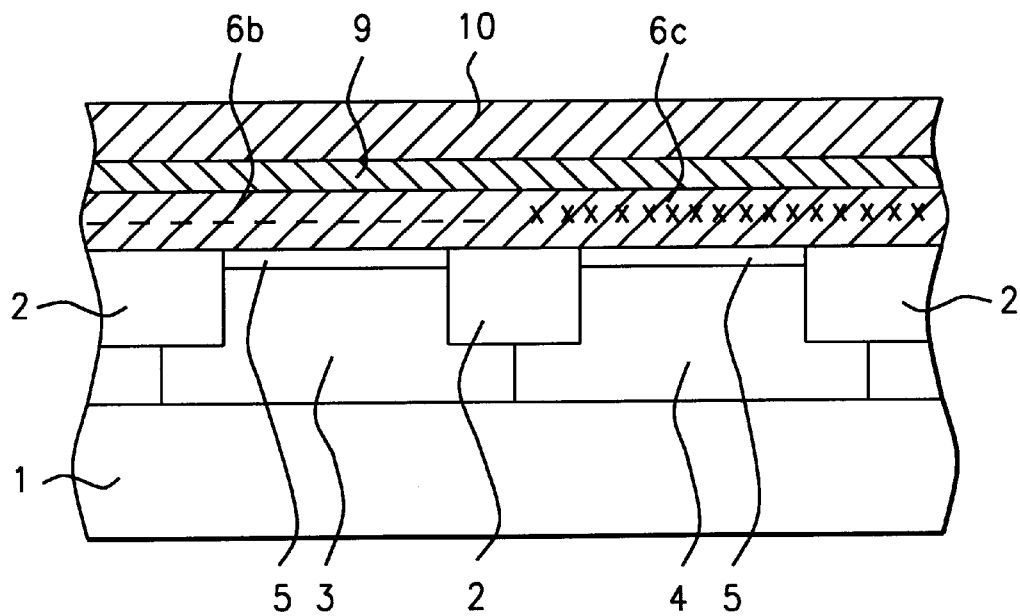

To reduce the resistance of subsequent word line structures, a metal silicide layer is formed on the underlying dual doped, polysilicon layer, comprised with N type region 6b, and P type region 6c. However the diffusion coefficient of the N type, and P type dopants, in the underlying dual doped polysilicon layer, are about 5 orders of magnitude higher in metal silicide, than in polysilicon. Therefore subsequent processing procedures, such as source/drain anneals, can allow dopants to diffuse from the underlying dual doped polysilicon layer, into the overlying metal silicide layer, followed by the fast diffusion of these dopants, through the metal silicide layer, and into the underlying dual doped polysilicon layer. This unwanted phenomena, arising as a result of the high diffusivity of dopants in metal silicide layer, compared to the slower diffusion rate of in polysilicon, can result in auto-doping in the dual doped polysilicon region, compensating the desired concentration of the specific dopant type, needed to achieve the desired work function, and threshold voltage. Therefore to avoid the above auto-doping phenomena, occurring primarily as a result of the diffusivity of dopants in metal silicide, but to still use a metal silicide layer for lower word line resistance, a buffer layer of undoped polysilicon, or amorphous silicon, is placed between the dual doped polysilicon component, and the metal silicide component, of the polycide, dual gate structure. An undoped polysilicon layer, or an undoped amorphous silicon layer 9, is deposited on the underlying dual doped polysilicon layer, via LPCVD procedures, at a thickness between about 400 to 1000 Angstroms. A metal silicide layer 10, such as tungsten silicide, is next deposited on the undoped polysilicon layer 9, via LPCVD procedures, at a thickness between about 500 to 1500 Angstroms, using silane and tungsten hexafluoride as reactants. The result of these depositions are schematically shown in FIG. 5.

Figure 6:
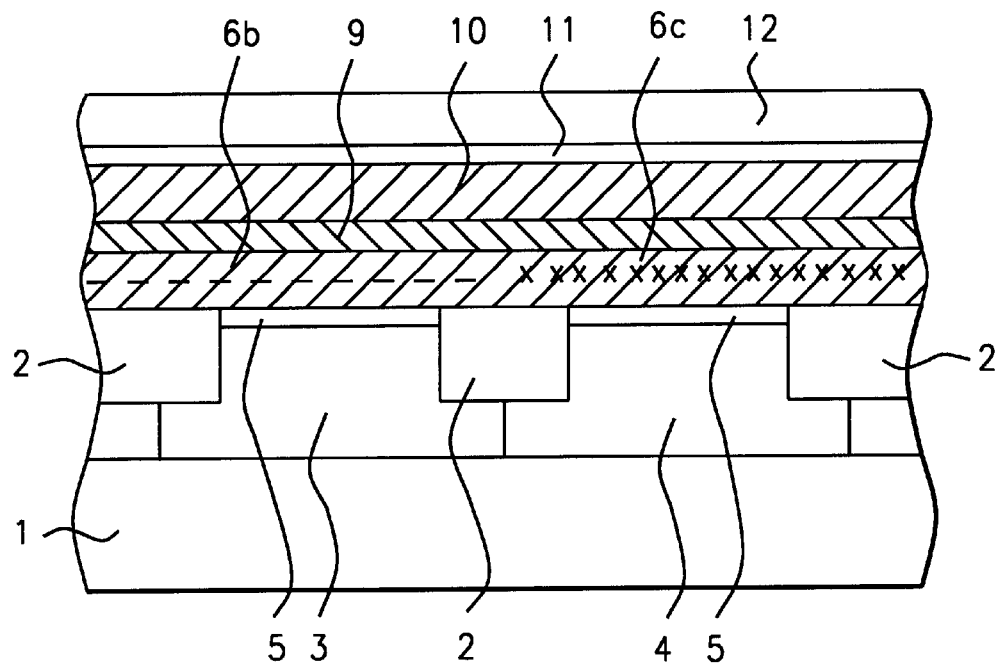
Figure 7A:
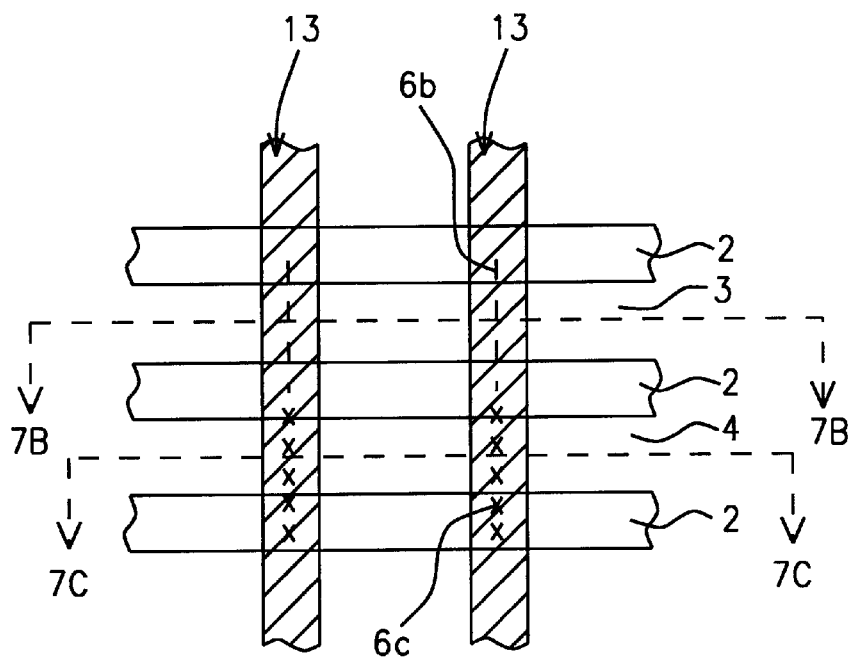

The deposition of capping insulator layers are next addressed and shown schematically in FIG. 6. A silicon oxide layer 11, is first deposited, via LPCVD or via plasma enhanced chemical vapor deposition, (PECVD), procedures, at a thickness between about 100 to 1000 Angstroms, using tetraethylorthosilicate, (TEOS), as a source. An overlying silicon nitride layer 12, is then deposited on underlying silicon oxide layer 11, via LPCVD or PECVD procedures, at a thickness between about 1000 to 3000 Angstroms. If desired the use of silicon oxide layer 11, can be omitted and only silicon nitride layer 12, now at a thickness between about 1500 to 3000 Angstroms, can be deposited on underlying metal silicide layer 10. Conventional photolithographic and anisotropic reactive ion etching, (RIE), procedures, using $CF_4$ as an etchant for silicon nitride layer 12, and for silicon oxide layer 11, and using $Cl_2$ as an etchant for metal silicide layer 10, for undoped polysilicon layer 9, and for the dual doped polysilicon layer, are employed to create polycide, dual gate structure 13, shown schematically for the top view, in FIG. 7A. Polycide, dual gate structure 13, comprised with N type polysilicon region 6b, overlying a subsequent nMOS device region, and comprised with P type polysilicon region 6c, traverses the CMOS cell. The removal of the photoresist shape, used to define polycide, dual gate structure 13, is accomplished using plasma oxygen ashing and careful wet cleans, with a buffered hydrofluoric acid procedure, used with the wet clean cycle, resulting in the removal of the regions of gate insulator layer 5, not covered by polycide, dual gate structure 13.

Figure 7B:
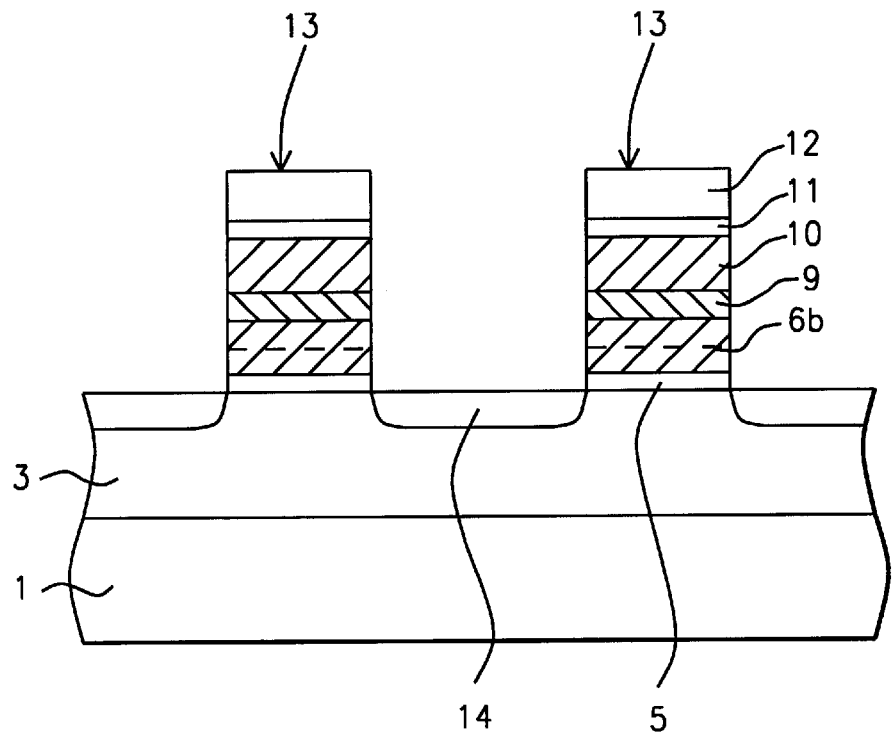
Figure 7C:
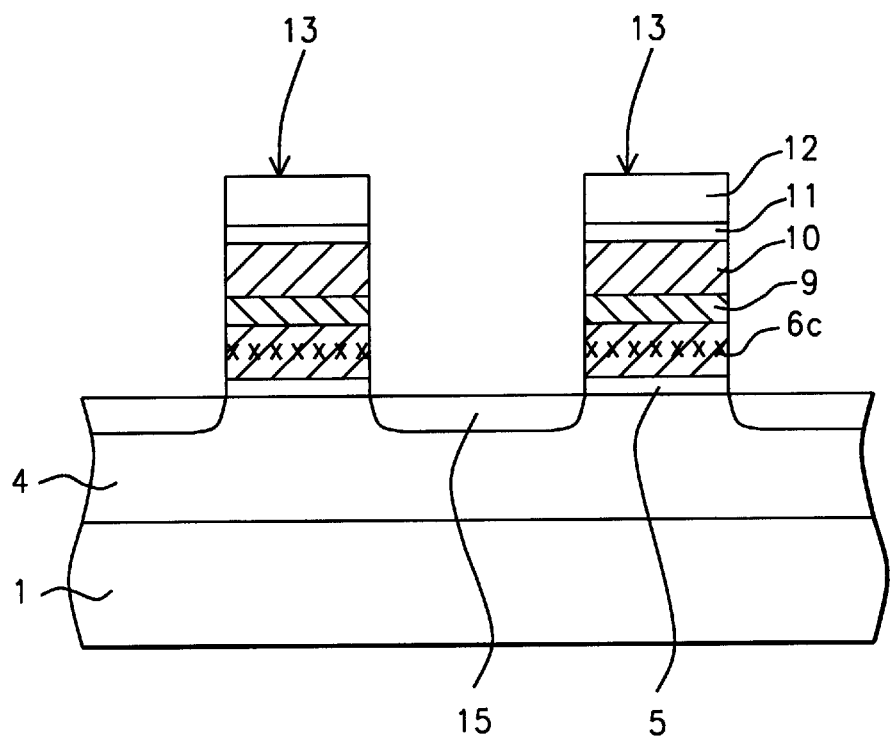

The formation of lightly doped source/drain, (LDD)), regions, for both nMOS and pMOS devices, is next addressed and schematically shown, in cross-sectional style, using FIGS. 7B and 7C, A first photoresist shape is used as a blockout mask, protecting subsequent pMOS regions, from an ion implantation procedure, used to create N type, LDD region 14, shown schematically in FIG. 7B. N type LDD region 14, is formed in an area of P well region 3, not covered by polycide, dual gate structure 13, via an implantation procedure using arsenic, or phosphorous ions, at an energy between about 10 to 60 KeV, at a dose between about 5E12 to 5E14 atoms/$cm^2$. After removal of the first photoresist shape, using plasma oxygen ashing and careful wet cleans, a second photoresist shape is used as a blockout mask, protecting nMOS regions, from an ion implantation procedure, used to create P type, LDD region 15, shown schematically in FIG. 7C. P type LDD region 15, is formed in an area of N well region 4, not covered by polycide, dual gate structure 13, via the implantation of boron, or $BF_2$ ions, at an energy between about 1 to 15 KeV, for boron ions, and at an energy between about 5 to 60 KeV, for $BF_2$ ions, both at a dose between about 1E13 to 5E14 atoms/$cm^2$. The second photoresist shape is removed again via plasma oxygen ashing and careful wet clean procedures.

Figure 8:
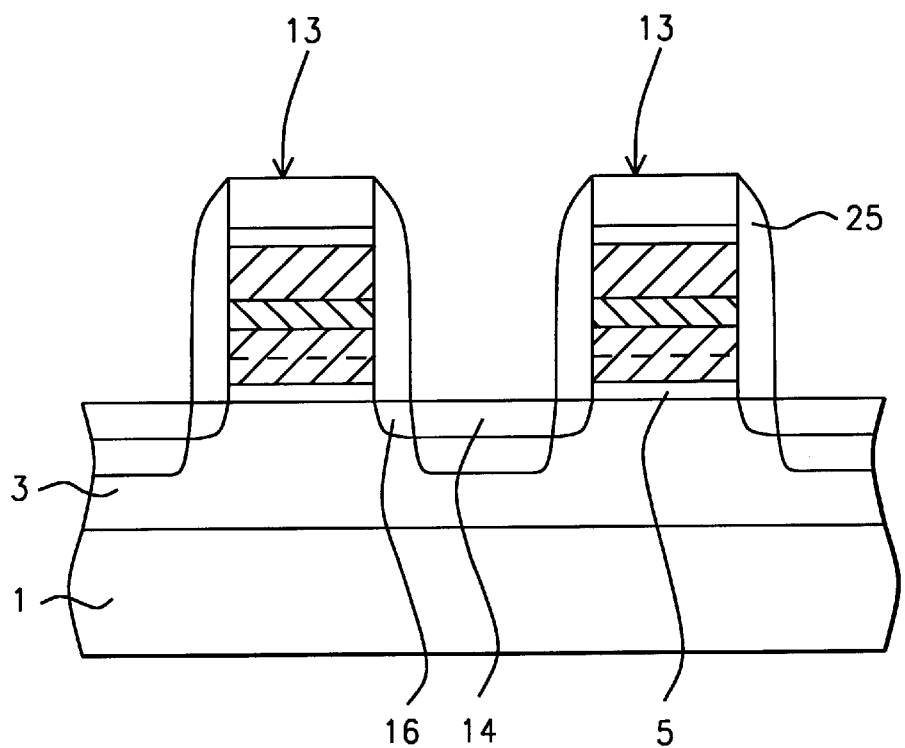

Insulator spacers 25, schematically shown in FIG. 8, are next formed on the sides of polycide, dual gate structure 13. A silicon nitride layer is first deposited, via LPCVD, or PECVD procedures, at a thickness between about 500 to 1500 Angstroms. An anisotropic RIE procedure, using $CHF_3$ as an etchant, is used to create silicon nitride, insulator spacers 25. A photoresist shape, again used as a blockout mask, is then used to protect pMOS devices, in N well region 4, from an ion implantation procedure, used to create N type, heavily doped source/drain region 16, in an area of P well region 3, not covered by polycide, dual gate structure 13, and not covered by insulator spacers 25. The implantation procedure used to create heavily doped source/drain region 25, shown schematically in FIG. 8, was performed using arsenic or phosphorous ions, at an energy between about 10 to 80 KeV, at a dose between about 1E15 to 1E16 atoms/$cm^2$. The photoresist blockout shape, used to protect pMOS devices from the heavily doped, N type ion implantation procedure, is again removed using plasma oxygen ashing and careful wet cleans. Heavily doped, P type source/drain regions, not shown in the drawings, are next created, using a photoresist blockout shape to protect nMOS devices, in P well region 3, from an ion implantation procedure, performed using boron or $BF_2$ ions, at an energy between about 2 to 15 KeV, for boron ions, and between about 10 to 60 KeV for $BF_2$ ions, both at a dose between about 1E15 to 1E16 atoms/$cm^2$. The P type, heavily doped source/drain region, is formed in an area of N well region 4, not covered by polycide, gate structure 13, or by insulator spacers 25. The photoresist blockout shape is once again removed via plasma oxygen ashing and careful wet cleans. A rapid thermal anneal, (RTA), procedure, performed at a temperature between about 900 to 1100° C., for a time between about 15 to 90 sec., is used to activate the implanted ions in all source/drain regions. The dopants in the dual doped polysilicon layer, in regions 6b, and 6C, may only diffuse into overlying undoped polysilicon layer 9, during this procedure, not moving into metal silicide layer 10, which could then auto-dope the underlying dual doped polysilicon layer, which would have occurred if undoped polysilicon layer 9, were not present.

Figure 9:
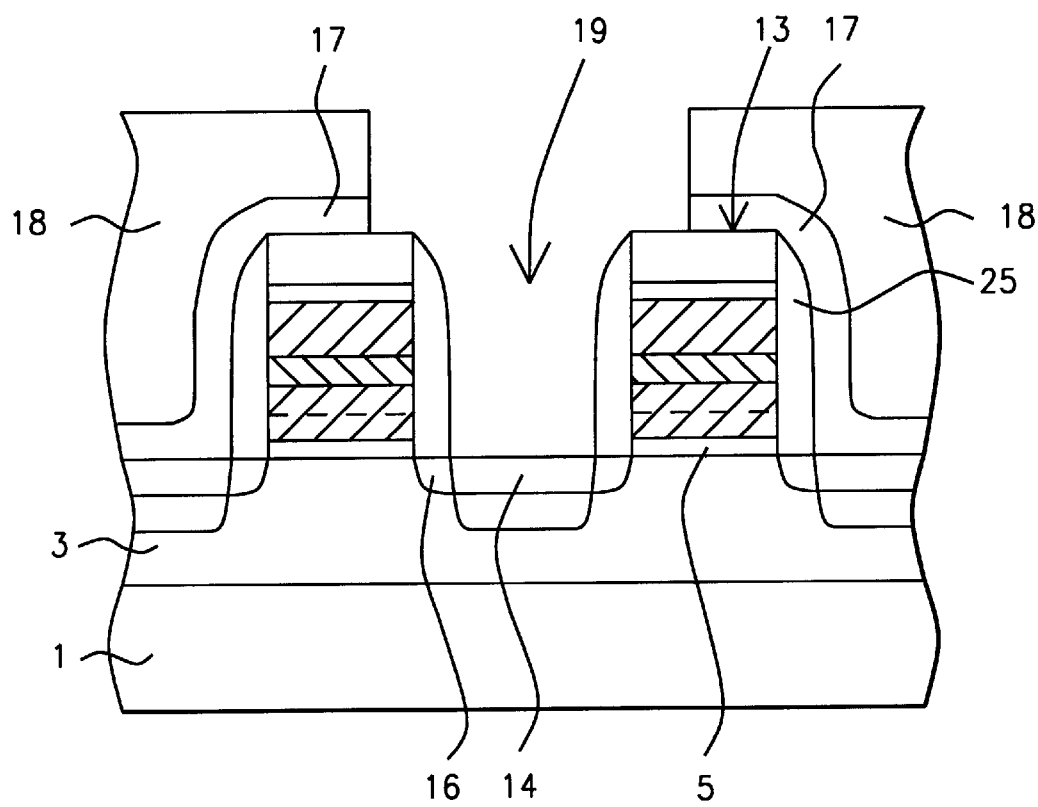

Borderless contacts, or self-aligned contact, (SAC), openings, are next formed, exposing the source/drain regions of the CMOS devices. First a silicon nitride layer 17, shown schematically in FIG. 9, is deposited, via LPCVD or PECVD procedures, at a thickness between about 150 to 600 Angstroms. Next insulator layer 18, comprised of silicon oxide, or of a borophosphosilicate glass, (BPSG), is deposited, again via LPCVD or PECVD procedures, to a thickness between about 6000 to 15000 Angstroms. A chemical mechanical polishing procedure is used for planarization purposes, resulting in a smoother top surface topography for insulator layer 18. Photolithographic and selective anisotropic RIE procedures are used to create SAC opening 19, schematically shown in FIG. 9. The selective RIE procedure consists of the use of $CHF_3$ as an etchant to selectively etch insulator layer 18, and slowing or stopping at the presence of silicon nitride layer 17. The SAC opening procedure is continued using $Cl_2$ or $SF_6$ as an etchant for silicon nitride layer 17. The SAC opening is formed with a diameter larger than the space between polycide, dual gate structures, therefore exposing the entire width of the source/drain regions. The use of conventional, or non-SAC openings, would have not allowed the use of minimum features. For example without the use of the borderless or SAC opening the spacing between the polycide, dual gate structures, would have to be increased to allow a contact hole to be opened between gate structures, to allow the required area of source/drain region to be exposed.

Polysilicon, or tungsten plug structures, not shown in the drawings, can now be formed in SAC opening 19, via deposition and chemical mechanical polishing procedures, avoiding the use of photolithographic processing. The formation of the polysilicon or tungsten, self-aligned contact plugs, do require deposition procedures, at temperatures in which auto-doping can occur in a polycide, dual gate structure, comprised without the undoped polysilicon layer, used in this invention, located between the metal silicide component, and the dual doped polysilicon component, of the polycide, dual gate structure.

While this invention has been particularly shown and described with reference to, the preferred embodiment thereof, it will be understood by those skilled in the art that various changes in form and details may be made without departing from the spirit and scope of this invention.

What is claimed is:

1. A method of fabricating a polycide, dual gate structure, on a semiconductor substrate, comprising the steps of:

providing an isolation region, in a first region of said semiconductor substrate;

providing a P well region, in a second region of said semiconductor substrate;

providing an N well region, in a third region of said semiconductor substrate;

growing a gate insulator layer, on regions of said semiconductor substrate, not occupied by said isolation region;

depositing a first undoped polysilicon layer;

converting said first undoped polysilicon layer to a dual doped polysilicon layer, with said dual doped polysilicon layer comprised of an N type doped, polysilicon region, located on a first portion of said gate insulator layer that overlays said P well region, and comprised of a P type doped, polysilicon region, located on second portion of said gate insulator layer that overlays said N well region;

depositing a second undoped polysilicon layer, on and in contact with said dual doped polysilicon layer;

depositing a metal silicide layer, on said second undoped polysilicon layer;

depositing a capping insulator layer on said metal silicide layer; and patterning of said capping insulator layer, of said metal silicide layer, of said second undoped polysilicon layer, and of said dual doped polysilicon layer, to create a polycide, dual gate structure, with a first portion of said polycide, dual gate structure, comprised with said N type doped, polysilicon region, overlying said P well region, and with a second portion of said polycide, dual gate structure comprised with said P type doped, polysilicon region, overlying said N well region.

2. The method of claim 1, wherein said isolation region is a silicon dioxide, field oxide region, formed at a thickness between about 2500 to 4000 Angstroms, in the first region of said semiconductor substrate, via a thermal oxidation procedure.

3. The method of claim 1, wherein said isolation region is an insulator filled shallow trench, formed in the first region of semiconductor substrate, via the definition of a shallow trench, to a depth between about 2500 to 5000 Angstroms in said semiconductor substrate, followed by the filling of the shallow trench with silicon oxide.

4. The method of claim 1, wherein said P well region, in the second region of said semiconductor substrate, is formed via an ion implantation procedure, using boron ions at an energy between about 150 to 300 KeV, at a dose between about 5E12 to 5E13 atoms/cm$^2$.

5. The method of claim 1, wherein said N well region, in the third region of said semiconductor substrate, is formed via an ion implantation procedure, using arsenic, or phosphorous ions, at an energy between about 200 to 1000 KeV, at a dose between about 5E12 to 5E13 atoms/cm$^2$.

6. The method of claim 1, wherein said gate insulator layer is a silicon dioxide layer, thermally grown to a thickness between about 20 to 200 Angstroms.

7. The method of claim 1, wherein said first undoped polysilicon layer is obtained via LPCVD procedures, at a thickness between about 1000 to 3000 Angstroms.

8. The method of claim 1, wherein said N type doped region, of said dual doped polysilicon layer, is created via an ion implantation procedure, using arsenic or phosphorous ions, at an energy between about 10 to 60 KeV, at a dose between about 1E15 to 6E15 atoms$^2$.

9. The method of claim 1, wherein said P type doped region, of said dual doped polysilicon layer, is created via an ion implantation procedure, using boron or $BF_2$ ions, at an energy between about 2 to 10 KeV, for boron ions, and between about 10 to 50 KeV for $BF_2$ ions, both at a dose between about 1E15 to 5E15 atoms/cm$^2$.

10. The method of claim 1, wherein said second undoped polysilicon layer is obtained via LPCVD procedures, at a thickness between about 400 to 1000 Angstroms.

11. The method of claim 1, wherein said metal silicide layer is a tungsten silicide layer, obtained via LPCVD procedures, at a thickness between about 500 to 1500 Angstroms, using silane and tungsten hexafluoride as a source.

12. The method of claim 1, wherein said capping insulator layer, is a silicon nitride layer, or a composite insulator layer, comprised of silicon nitride on silicon oxide, obtained via LPCVD or PECVD procedures, at a thickness between about 1500 to 3000 Angstroms.

13. The method of claim 1, wherein said polycide, dual gate structure, comprised of said metal silicide, of said undoped polysilicon layer, and of said dual doped polysilicon layer, is created via an anisotropic RIE procedure, using $Cl_2$ as an etchant.

14. A method of fabricating a complementary metal oxide semiconductor, (CMOS), device, on a semiconductor substrate, comprised with a polycide, dual gate structure, with the polycide, dual gate structure featuring an undoped polysilicon layer, located underlying a metal silicide layer, and overlying a dual doped polysilicon layer, comprising the steps of:

forming an isolation region, in a first region of said semiconductor substrate;

forming a P well region, in a second region of said semiconductor substrate;

forming an N well region, in a third region of said semiconductor substrate, separated from said P well region, by said isolation region;

forming threshold voltage adjust regions, in said P well region, and in said N well region;

growing a silicon dioxide gate layer on the top surface of said P well region, and on the to surface of said n well region;

depositing a first undoped polysilicon layer;

forming said dual doped polysilicon layer via creation of an N type doped region, in a first portion, of said first undoped polysilicon layer, in a region overlying said P well region, and via creation of a P type doped region, in a second portion of said first undoped polysilicon layer, in a region overlying said N well region;

depositing a second undoped polysilicon layer, on and in contact with said dual doped polysilicon layer;

depositing a tungsten silicide layer, on said second undoped polysilicon layer;

depositing a capping insulator layer on said tungsten silicide layer;

patterning of said capping insulator layer, of said tungsten silicide layer, of said second undoped polysilicon layer, and of said dual doped polysilicon layer, to create said polycide, dual gate structure, comprised with said dual doped polysilicon layer, underlying said second undoped polysilicon layer, with said dual doped polysilicon layer featuring said N type doped region, overlying said P well region, and featuring said P type doped region overlying said N well region;

forming an N type, lightly doped source/drain region, in an area of said P well region, not covered by said polycide, dual gate structure;

forming a P type, lightly doped source/drain region, in an area of said N well region, not covered by said polycide, dual gate structure;

forming insulator spacers on the sides of said polycide, dual gate structure;

forming an N type, heavily doped source/drain region, in an area of said P well region, not covered by said polycide dual gate structure, and not covered by said insulator spacers;

forming a P type, heavily doped source/drain region, in an area of said N well region, not covered by said polycide, dual gate structure, and not covered by said insulator spacers;

depositing a silicon nitride layer;

depositing an interlevel dielectric, (ILD), layer;

planarizing said ILD layer;

forming self-aligned contact openings, in said ILD layer, and in said silicon nitride layer, exposing said N type, heavily doped source/drain region, and exposing said P type, heavily doped source drain region, and with the diameter of said SAC openings, larger than the space between polycide, dual gate structures; and forming conductive plug structures, in said SAC openings.

15. The method of claim 14, wherein said isolation region is an insulator filled, shallow trench region, obtained via forming a shallow trench in said semiconductor substrate, to a depth between about 2500 to 5000 Angstroms, via anisotropic RIE procedures, using $Cl_2$ as an etchant, followed by filling of the shallow trench with a silicon oxide layer, obtained via LPCVD or PECVD procedures, with unwanted regions of the silicon oxide layer removed via a chemical mechanical polishing procedure.

16. The method of claim 14, wherein said P well region is formed via an ion implantation procedure, using boron ions at an energy between about 150 to 300 KeV, at a dose between about 5E12 to 5E13 atoms/$cm^2$.

17. The method of claim 14, wherein said N well region is formed via an ion implantation procedure, using arsenic, or phosphorous ions, at an energy between about 200 to 1000 KeV, at a dose between about 5E12 to 5E13 atoms/$cm^2$.

18. The method of claim 14, wherein said silicon dioxide gate layer is obtained via thermal oxidation, at a thickness between about 20 to 200 Angstroms.

19. The method of claim 14, wherein said first undoped polysilicon layer is obtained via LPCVD procedures, at a thickness between about 1000 to 3000 Angstroms.

20. The method of claim 14, wherein said N type doped region, in said first portion, of said dual doped polysilicon layer, is obtained via an ion implantation procedure, using arsenic, or phosphorous ions, at an energy between about 10 to 60 KeV, at a does between about 1E15 to 6E15 atoms/$cm^2$.

21. The method of claim 14, wherein said P type doped region, in said second portion, of said dual doped polysilicon layer, is obtained via an ion implantation procedure, using boron or $BF_2$ ions, at an energy between about 2 to 10 KeV, for boron ions, and between about 10 to 50 KeV, for $BF_2$ ions, both at a dose between about 1E15 to 5E15 atoms/$cm^2$.

22. The method of claim 14, wherein said second undoped polysilicon layer is obtained via LPCVD procedures, at a thickness between about 400 to 1000 Angstroms.

23. The method of claim 14, wherein said tungsten silicide layer is obtained via LPCVD procedures, at a thickness between about 500 to 1500 Angstroms, using silane and tungsten hexafluoride as reactants.

24. The method of claim 14, wherein said capping insulator layer is either a silicon nitride layer, of a composite layer comprised of an overlying silicon nitride layer, and an underlying silicon oxide layer.

25. The method of claim 14, wherein said polycide, dual gate structure, is formed via an anisotropic RIE procedure, using $Cl_2$ as an etchant for the tungsten silicide layer, for the second undoped polysilicon layer, and for the dual doped polysilicon layer.

26. The method of claim 14, wherein said insulator spacers are silicon nitride spacers, formed via the deposition of a silicon nitride layer, via LPCVD or PECVD procedures, at a thickness between about 500 to 1500 Angstroms, then followed by an anisotropic RIE procedure, using $CHF_3$ as an etchant for silicon nitride.

27. The method of claim 14, wherein said N type, heavily doped source/drain region, is formed via ion implantation of arsenic, or phosphorous ions, at an energy between about 10 to 80 KeV, at a dose between about 1E15 to 1E16 atoms/$cm^2$.

28. The method of claim 14, wherein said P type, heavily doped source/drain region, is formed via ion implantation of boron or $BF_2$ ions, at an energy between about 2 to 15 KeV, for boron ions, and between about 10 to 60 KeV, for $BF_2$ ions, both at a dose between about 1E15 to 1E16 atoms/$cm^2$.

29. The method of claim 14, wherein said ILD layer is either a silicon oxide layer, or a borophosphosilicate layer, obtained via LPCVD or PECVD procedures, at a thickness between about 6000 to 15000 Angstroms.

30. The method of claim 14, wherein said SAC opening, is created via a selective, anisotropic RIE procedure, using $CHF_3$ as an etchant for said ILD layer, and using $Cl_2$ or $SF_6$ as an etchant for the silicon nitride layer.

* * * * *